United States Patent
Eiderman et al.

(10) Patent No.: US 6,433,708 B1
(45) Date of Patent: Aug. 13, 2002

(54) METHOD OF ENCODING BINARY DATA

(75) Inventors: Aryeh Eiderman, Jerusalem (IL); Israel Marelus, Antwerp (BE)

(73) Assignee: Netstrap Ltd., Jerusalem (IL)

( * ) Notice: Subject to any disclaimer, the term of this patent is extended or adjusted under 35 U.S.C. 154(b) by 0 days.

(21) Appl. No.: 09/518,821

(22) Filed: Mar. 6, 2000

(30) Foreign Application Priority Data

Mar. 16, 1999 (IL) .................................. 129008

(51) Int. Cl.$^7$ .................................. H03M 7/00

(52) U.S. Cl. .......................................... 341/50; 341/67

(58) Field of Search ............................... 341/50, 67, 76, 341/94, 95, 55; 364/900; 340/347

(56) References Cited

U.S. PATENT DOCUMENTS 4,232,375 A * 11/1980 Paugstat et al. ............ 364/900
5,077,552 A * 12/1991 Abbate ................... 340/825.25
5,392,037 A * 2/1995 Kato ........................... 341/67

* cited by examiner

*Primary Examiner*—Peguy Jeanpierre
*Assistant Examiner*—Joseph J Lauture
(74) *Attorney, Agent, or Firm*—Hedman & Costigan, P.C.

(57) ABSTRACT

The invention provides a method of encoding an unencoded block of binary data having a known number of binary units, into an encoded block of binary data having a number of binary units greater than the number of binary units in the unencoded block, for transfer from a computer of origin to a recipient computer and decoding thereat, including the steps of evaluating the data contained in each binary unit of the unencoded block, thereby to obtain, for the unencoded data in each binary unit, a primary number and a secondary number; entering the primary number for the unencoded data in each binary unit into an encoded binary unit of an encoded binary unit block, wherein for the data in each binary unit, the position of the encoded binary unit corresponds to the position of the unencoded binary unit; and entering the secondary number for the unencoded data in each binary unit into one or more additional control binary units in the encoded block, whereby the secondary number for each unencoded binary unit contains a value and position identifier for the unencoded data contained in each binary unit of the unencoded block.

4 Claims, 1 Drawing Sheet

METHOD OF ENCODING BINARY DATA

FIELD OF THE INVENTION

The present invention relates to the encoding of binary data for transfer between computers connected via a network.

BACKGROUND OF THE INVENTION

While computer networks, such as local area networks, have existed for many years, the problem of encoding binary data for transmission between client computers has become a widespread global consideration since the advent of the Internet and e-mail.

By way of introduction, it is known that a single byte contains up to 8 bits of information, each of which has a value between 0 and 255, as per the IBM EBCDIC (Extended Binary Coded Decimal Interchange Code). It is further known that, in the ASCII system, each of the 127 characters has a numerical code from 0–126, such that, for example, the letter "B" has a value of 66, the letter "D" has a value of 68, and so on.

Additional characters may be assigned, in an 8 bit system, predetermined numerical values from 127 to 255. However, as some data receiving protocols are based on a 7 bit data system, 8 bit data must be divided into two bytes.

A problem stemming from transmission of data between computers is caused by the fact that all computer files which contain other than the standard 95 ASCII characters, whether these files contain text, image or sound data, must be not only encoded so as to render them transmittable, but also decodable by software resident on recipient computers which may have different operating systems employing different compilers. Examples of some of the different systems used are DOS and Windows 95/98, which are used by PC's, as well as those employed by Unix and Macintosh computers.

Basically, solutions which exist for preparing binary data for transmission over the Internet all entail the use of encoding routines which, due to the transformation of the data into a decodable binary format, expand the data. The expanded data also requires a certain transmission time corresponding, inter alia, to the volume of transmitted data. Clearly, a certain time is also taken to encode the data at the computer of origin, and to decode the data at the recipient computer, prior to rendering the data accessible thereat.

Currently, two encoding systems are used for facilitating binary data transmission, 3 to 4 byte systems (herein referred to as "3to4"), such as the so-called UUencode, "XX," "MIME64," and "BinHex," wherein 3 bytes are encoded into a 4 byte form, so as to have an expansion ratio of approximately 33% in the volume of data; and the "BtoA" system, wherein 4 bytes are encoded into a 5 byte form, so as to have an expansion ratio of only 25%.

While the 3to4 systems operate on the basis of a 64 character table, the BtoA system operates on the basis of a table of 85 characters, and is thus more flexible. According to this system, when encoding 4 bytes of data which may be selected from any of the 256 characters of the EBCDIC, there are evaluated 5 bytes, each having a value selected from one of 85 different characters.

As known, both prior art systems evaluate a binary expression—be this 3 bytes in a 3to4 system or 4 bytes in the BtoA system—and encode it by multiplying each byte in a selected block by 256 taken to a power corresponding to the position of the byte in the block, and thereafter adding the results so as to achieve a single multiple digit number. This number is then divided successively by the base number (64 or 85) so as to receive a series of remainders or modulos, each of which is stored in a selected byte in a predetermined sequence, thereby to obtain a preliminary encoded information block. In BtoA, so as to render the information contained in each byte in the readable/printable range (32–126), and thereby obtain the final encoded block which is to be transferred to a recipient computer, a value of 33 is added to each byte in the block. Encoding is essentially achieved by performing the above motions in reverse.

It is thus seen that data is both encoded and decoded by time and resource intensive manipulation of the numerical code sequences. Accordingly, while BtoA has a relative advantage over 3to4 systems due to its lower expansion ratio, a disadvantage inherent in the BtoA system is its relative slowness of encoding and decoding operations.

With the advent of the commercialization of the Internet, more powerful and faster computers have become commonly available. However, notwithstanding an increased computing power available, the relative slowness of the above-described known methods of encoding and decoding binary data has become much more noticeable and thus much more of a problem. This problem continues to constitute a bottleneck in data transmission as the transmission bandwidths that become available increase.

DEFINITION

Throughout the specification and claims, the term "binary unit" is used to mean any portion of a binary data block, of which a byte is merely an example in which the binary unit has 8 bits.

SUMMARY OF THE INVENTION

The present invention seeks to provide an improved method of encoding binary data for transmission between two or more computers, having an encoding/decoding speed at least an order of magnitude greater than the 3to4 system.

There is thus provided, in accordance with a preferred embodiment of the invention, a method of encoding an unencoded block of binary data having a known number of binary units, into an encoded block of binary data having a number of binary units greater than the number of binary units in the unencoded block, for transfer from a computer of origin to a recipient computer and decoding thereat, including the following steps:

evaluating the data contained in each binary unit of the unencoded block, thereby to obtain, for the unencoded data in each binary unit, a primary number and a secondary number;

entering the primary number for the unencoded data in each binary unit into an encoded binary unit of an encoded binary unit block, wherein for the data in each binary unit, the position of the encoded binary unit corresponds to the position of the unencoded binary unit; and entering the secondary number for the unencoded data in each binary unit into one or more additional control binary units in the encoded block, whereby the secondary number for each unencoded binary unit contains a value and position identifier for the unencoded data contained in each binary unit of the unencoded block.

Additionally in accordance with a preferred embodiment of the invention, the step of entering the secondary number, includes the steps of:

evaluating a control number as a function of the secondary numbers, including value and position identifiers for the unencoded data contained in each binary unit of the unencoded block; and entering the control number into the one or more additional control binary units in the encoded block.

Further in accordance with a preferred embodiment of the present invention, the primary number for the unencoded data in each binary unit is MOD(B/b), in which B is the data in the binary unit, and b is the encoding base; and the secondary number for the unencoded data in each binary unit is INT(B/b).

Additionally in accordance with a preferred embodiment of the invention, the control number is represented by the following expression:

$$\sum_{i=1}^{L} [INT(B_i/b) * (INT((Cnc_{max} - 1)/b) + 1)^{(L-i)}]$$

wherein

L=number of binary units in the unencoded block, $Cnc_{max}$=the maximum number of character codes used for encoding, and i=position of binary unit in the unencoded block.

Preferably, the system of the invention is a 4 to 5 system, such that L=4, $Cnc_{max}$=256, 86≦b≦95, and INT(($Cnc_{max}$−1)/b)+1=3.

DETAILED DESCRIPTION OF A PREFERRED EMBODIMENT

Figure 1:
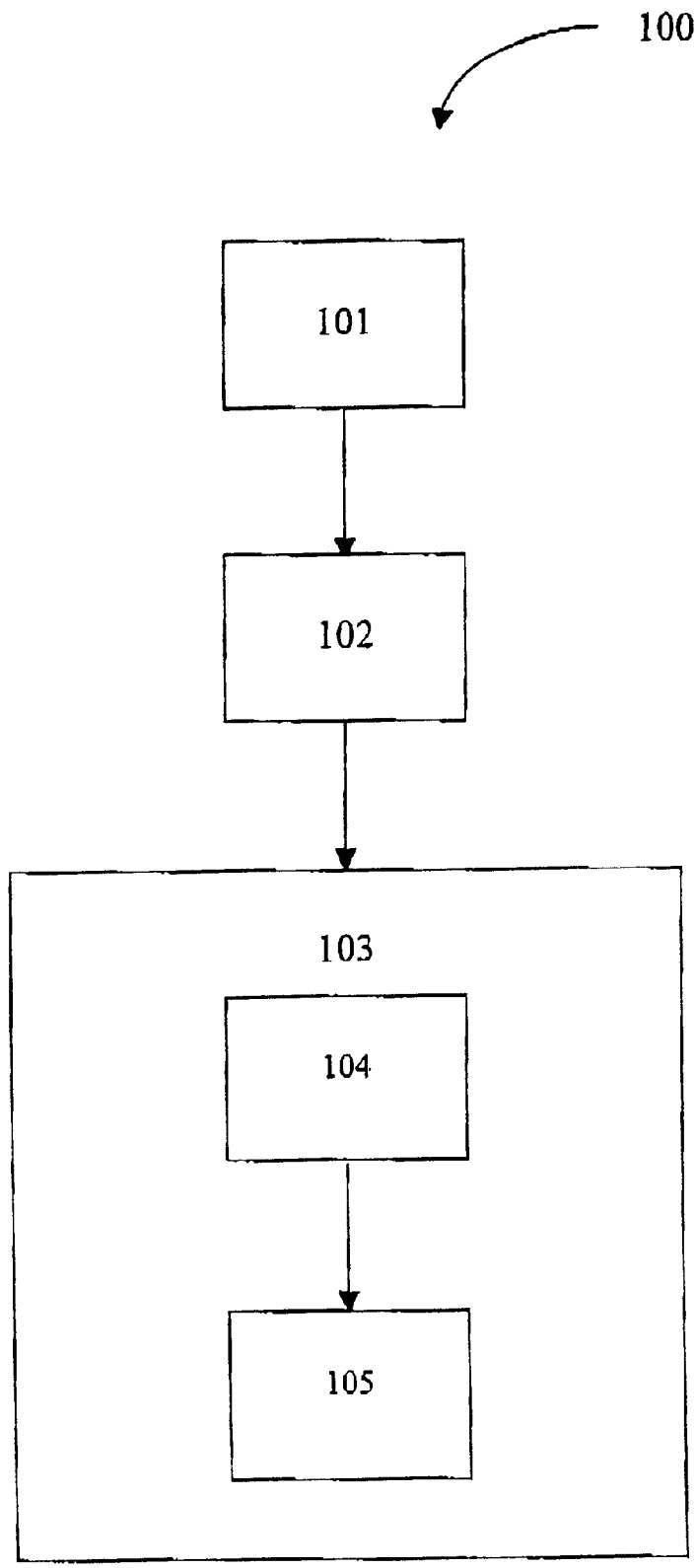
FIG. 1 is a flowchart which outlines the method encoding a block of binary data into an encoded block of binary data.

The present invention provides an improved method of encoding binary data for transmission between two or more computers, which works preferably on a 4 to 5 system, thereby having an expansion ratio of preferably no greater than 25%. As opposed to the BtoA system, however, and as will be appreciated from the description below, the present invention employs a method of calculation which facilitates a speed of encoding which is substantially faster than the above-mentioned prior art systems.

The method of the present invention employs a table which, in the 4 to 5 system, may be between 86 and 95 characters, this thus being the encoding calculation "base," as employed below. Other systems, such as a 9 to 11 system, mentioned below, operate on a base selected from a portion of this range only. The method of the invention, furthermore, employs an algorithm which, together with the use of an expanded table renders encoding and decoding of non-compressed binary data substantially faster than both the 3to4 and BtoA systems.

As seen in 100 of FIG. 1, the schematic block 101 stands for the step of evaluating the data contained in each binary unit of the unencoded block. Schematic block 102 stands for the step of entering the primary number for the unencoded data in each binary unit into an encoded binary unit of an encoded binary unit block while schematic block 103 stands for the step of entering the secondary number for the unencoded data in each binary unit into one or more additional binary units including the step 104 of evaluating a control number and step 105 of entering the control number.

As seen in the tables below, in accordance with the method of the present invention, a Stage I or preliminary encoded block, depicted in Table II, which results from an unencoded 4 byte sequence (Table I), is a block with five bytes. As will be appreciated from the following description, however, the method of the present invention relates to the information of each of the four original bytes as a distinct data entry, to which a code key is provided by means of a control number N provided in the additional byte in the coded block. As in the prior art, the preliminarily encoded data contained in each byte (after Stage I), is further processed, so as to render the final, Stage II encoded data in the readable/printable range. This may be done by adding a predetermined value to the encoded data, or by use of a translation table, for example, the precise nature of which is beyond the scope of the present invention.

In more detail, it is thus seen that, in the Stage I encoded block (Table II), four bytes are for the modulo of each number after division by the base number, e.g. 86, and the additional byte is for a control number N. While the control byte is preferably positioned in the first portion of the encoded block, it may alternatively be placed in any suitable, other portion of the encoded block.

As seen below by expression (I), N is calculated so as to be a number which reflects the sum of product of each integer resulting from division of each number in the sequence by the base (e.g. 86), and its position identifier seen in table I. In the present exemplary system, a maximum of 256 '$Cnc_{max}$' (character number codes) codes are employed, and the base 'b' is in the range 86–95. Accordingly, as ($Cnc_{max}$−1)/b<3, i.e. the integer obtained after division of any character by the base can only be 0, 1, or 2, the smallest position multiplier is INT(($Cnc_{max}$−1)/b)+1 which, in the present example, is 3.

It is envisaged, however, that for systems employing a greater number of codes than in the EBCDIC system, in which ($Cnc_{max}$−1)/b≧3, a position multiplier greater than 3 may be required.

In the example seen in Tables I II and III, four characters, represented by letters S, T, U and V are provided. The encoded number for each of the four original characters is evaluated as a primary number and a secondary number.

The primary number is the modulo for that number; e.g. for byte 1, the encoded number is MOD(S/b); for byte 2, the encoded number is MOD(T/b), and so on. An additional 'control' byte is also provided, located in any predetermined position in the encoded data.

The control byte contains the control number N, which is a single number indicative—for each of the remaining four bytes—of the secondary number or integer by which the base must be multiplied and to which the modulo of each byte must be added, in order to obtain the unencoded character.

Control number N is represented, in the present example, by the following expression:

$$N = \sum_{i=1}^{L} [INT(B_i/b) * (INT((Cnc_{max} - 1)/b) + 1)^{(L-i)}] \quad (I)$$

wherein

L=number of binary units in unencoded block

B=data in a binary unit, e.g. in binary units S, . . . , V, and i=position of a binary unit in unencoded block.

Due to the limited number of mathematical possibilities in evaluating the above expression, it is solved, in accordance with the present invention, by use of simple mathematical operations, including addition, subtraction, and comparison, and without any multiplication, division or evaluation of powers. An example of an encoding procedure performed in accordance with a preferred embodiment of the present invention, is shown in APPENDIX I, below.

For the example shown and described in conjunction with seen in tables I, II and III, below, the above expression can be expanded as follows:

$$N = SUM[INT(S/b)*3^3 + INT(T/b)*3^2 + INT(U/b)*3^1 + INT(V/b)*3^0].$$

It is thus seen, that the modulo of each byte is returned thereto, and the resulting integer is multiplied by $3^n$ where 'n' corresponds to the indicated byte position so as to provide, for each byte, a value and position identifier (VPI). As described above, the sum of the VPI's for all the bytes becomes the control number N.

TABLE I

| | Unencoded sequence | | | |
|---|---|---|---|---|
| Position identifier | 1 | 2 | 3 | 4 |
| Byte value | S | T | U | V |

TABLE II

| | Stage I Encoded seguence | | | | |
|---|---|---|---|---|---|
| Stage I encoded byte value | N | MOD(S/b) | MOD(T/b) | MOD(U/b) | MOD(V/b) |

TABLE III

| | Stage II Encoded sequence | | | | |
|---|---|---|---|---|---|
| Stage II encoded byte value | f[MOD(S/b)] | f[MOD(T/b)] | f[MOD (U/b)] | f[MOD (V/b)] | f[N] |

The Stage II encoded sequence includes encoded data after being transformed in any suitable manner, the scope of which is beyond the present invention, so as to be in a readable/printable range.

It will thus be appreciated that, among advantages of the method of the resent invention, is included the fact that the arithmetic manipulations performed for each binary unit of information sought to be transmitted are minimal, due to the individual consideration of each binary unit separately, rather than the more complicated manipulations performed in the prior art. This, while the present invention has an expansion ration of only 25%, rendering the small volume of data to be transmitted, the time taken to encode and decode the data is considerably less than any method used in the prior art.

Furthermore, due to the simplicity of the present method, it can be used by any compiler, even an 8 bit compiler, without substantially affecting speed. It further more, may be used on any desired platform, including DOS, Microsoft Windows, and UNIX.

It will further be appreciated that, while the invention has been exemplified in a 4 to 5 system, i.e. with the addition of a single control binary unit, it is envisaged that additional systems may be provided, these systems preferably having smaller expansion ratios than 25%, such as, 9 to 11, in which case a plurality of control binary units may be employed.

It will be appreciated by persons skilled in the art that the scope of the present invention is not limited by what has been shown and described hereinabove, merely by way of example. Rather, the present invention is limited solely by the claims, which follow.

APPENDIX I

The following is one example showing a simple encoding procedure, in accordance with a preferred embodiment of the present invention, employing addition, subtraction operations only, substantially as described above, for encoding the number 86 on a 4 to 5 system.
In order to evaluate INT[z/86] and MOD[z/86], as INT[z/86] can only be 0, 1 or 2, then
1) let z = (INT[z/86]*86)+MOD[z/86]
2) let x = INT[z/86]
3) let y = MOD[z/86]
4) so z = (x*86)+y
5) initialization
    x:=0; y:=z;
6) loop
    while y≧86 do
        begin
            x:=x+1;
            y:=y−86;
        end

What is claimed is:

1. A method of encoding an unencoded block of binary data having a known number of binary units, into an encoded block of binary data having a number of binary units greater than the number of binary units in the unencoded block, for transfer from a computer of origin to a recipient computer and for decoding thereat, including the following steps:
    evaluating the data contained in each binary unit of the unencoded block, thereby to obtain, for the unencoded data in each binary unit, a primary number and a secondary number;
    entering the primary number for the unencoded data in each binary unit into an encoded binary unit of an encoded binary unit block, wherein for the data in each binary unit, the position of the encoded binary unit corresponds to the position of the unencoded binary unit; and
    entering the secondary number for the unencoded data in each binary unit into one or more additional control binary units in the encoded block, and wherein said step of entering the secondary number, includes the steps of:
    evaluating a control number as a function of the secondary numbers, including value and position identifiers for the unencoded data contained in each binary unit of the unencoded block; and
    entering the control number into the one or more additional control binary units in the encoded block.

2. A method according to claim 1, wherein the primary number for the unencoded data in each binary unit is MOD(B/b), in which B is the data in the binary unit, and b is the encoding base; and the secondary number for the unencoded data in each binary unit is INT(B/b).

3. A method according to claim 2, wherein the control number is represented by the following expression:

$$\sum_{i=1}^{L} [INT(B_i/b) * (INT((Cnc_{max} - 1)/b) + 1)^{(L-i)}]$$

wherein
    L=number of binary units in the unencoded block,
    $Cnc_{max}$=the maximum number of character codes used for encoding, and
    i=position of binary unit in unencoded block.

4. A method according to claim 3, wherein L=4, $Cnc_{max}$= 256, 86≦b≦95, and INT(($Cnc_{max}$−1)/b)+1=3.

* * * * *